(12) United States Patent
Kado et al.

(10) Patent No.: US 10,304,902 B2
(45) Date of Patent: May 28, 2019

(54) MAGNETIC MEMORY DEVICE

(71) Applicant: Toshiba Memory Corporation, Tokyo (JP)

(72) Inventors: Masaki Kado, Kamakura Kanagawa (JP); Tsuyoshi Kondo, Kawasaki Kanagawa (JP); Yasuaki Ootera, Yokohama Kanagawa (JP); Takuya Shimada, Kawasaki Kanagawa (JP); Michael Arnaud Quinsat, Yokohama Kanagawa (JP); Nobuyuki Umetsu, Kawasaki Kanagawa (JP); Susumu Hashimoto, Nerima Tokyo (JP); Shiho Nakamura, Fujisawa Kanagawa (JP); Hideaki Aochi, Yokkaichi Mie (JP); Tomoya Sanuki, Suzuka Mie (JP); Shinji Miyano, Tokyo (JP); Yoshihiro Ueda, Yokohama Kanagawa (JP); Yuichi Ito, Yokkaichi Mie (JP); Yasuhito Yoshimizu, Yakkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/917,145

(22) Filed: Mar. 9, 2018

(65) Prior Publication Data

US 2019/0088712 A1     Mar. 21, 2019

(30) Foreign Application Priority Data

Sep. 19, 2017  (JP) .................................. 2017-178745

(51) Int. Cl.
*G11C 11/16*      (2006.01)
*H01L 27/22*      (2006.01)
(Continued)

(52) U.S. Cl.
CPC ........ *H01L 27/226* (2013.01); *G11C 11/1673* (2013.01); *G11C 11/1675* (2013.01); *H01L 43/10* (2013.01); *H01L 43/12* (2013.01)

(58) Field of Classification Search
CPC ....... H01L 27/226; H01L 43/10; H01L 43/12; G11C 11/1673; G11C 11/1675
(Continued)

(56) References Cited

U.S. PATENT DOCUMENTS 8,787,077 B2 *   7/2014   Saida ................... G11C 11/161
                                                      365/158
10,020,039 B2 *  7/2018   Fukami .................. H01L 43/08
(Continued)

FOREIGN PATENT DOCUMENTS

JP            2016-9806 A        1/2016

*Primary Examiner* — Xiaochun L Chen
(74) *Attorney, Agent, or Firm* — Finnegan, Henderson, Farabow, Garrett & Dunner, L.L.P.

(57) ABSTRACT

According to one embodiment, a magnetic memory device includes a first magnetic member, a first magnetic layer, and a first nonmagnetic layer. The first magnetic member includes a first extension portion and a third portion. The first extension portion extends along a first direction and includes a first portion and a second portion. The third portion is connected to the second portion. A direction from the first portion toward the second portion is aligned with the first direction. At least a portion of the third portion is tilted with respect to the first direction. The first nonmagnetic layer is provided between the first magnetic layer and the at least a portion of the third portion. The first nonmagnetic layer is provided along the at least a portion of the third portion and is tilted with respect to the first direction.

17 Claims, 8 Drawing Sheets

(51) Int. Cl.
*H01L 43/10* (2006.01)
*H01L 43/12* (2006.01)

(58) Field of Classification Search
USPC .......................................................... 365/158
See application file for complete search history.

(56) References Cited

U.S. PATENT DOCUMENTS

| | | | |
|---|---|---|---|
| 10,032,499 B2* | 7/2018 | Kado | G11C 19/0841 |
| 2004/0252538 A1* | 12/2004 | Parkin | G11C 11/14 |
| | | | 365/80 |
| 2013/0235653 A1 | 9/2013 | Kondo et al. | |
| 2014/0085969 A1* | 3/2014 | Saida | G11C 11/1675 |
| | | | 365/158 |
| 2014/0126280 A1* | 5/2014 | Annunziata | G11C 11/1675 |
| | | | 365/158 |
| 2014/0204487 A1* | 7/2014 | Hase | H01L 43/08 |
| | | | 360/244 |
| 2015/0380638 A1 | 12/2015 | Ootera et al. | |
| 2016/0247550 A1* | 8/2016 | Fukami | H01L 43/08 |
| 2017/0229640 A1* | 8/2017 | Kado | G11C 11/1675 |

* cited by examiner

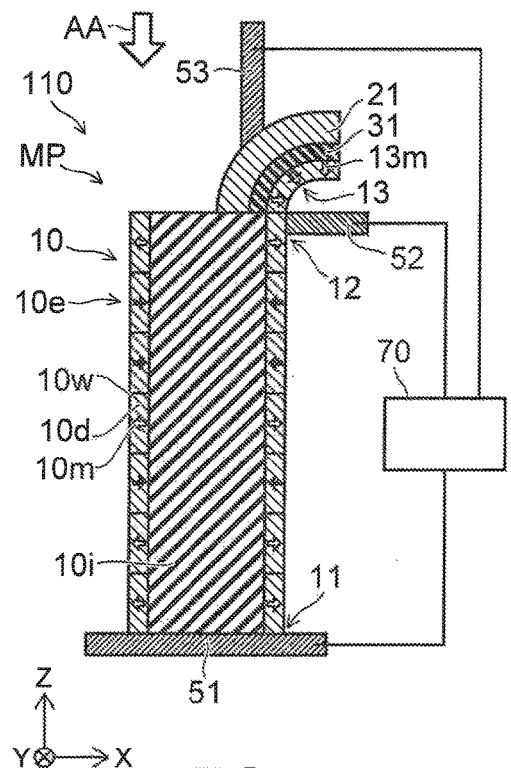
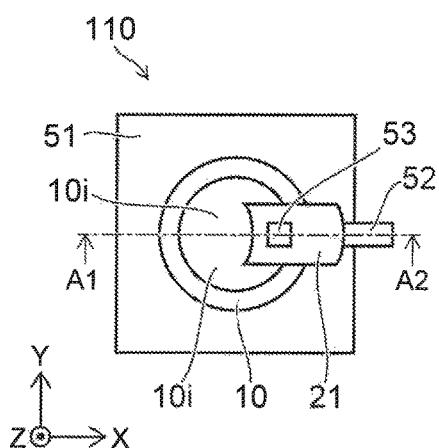
FIG. 1A    FIG. 1B
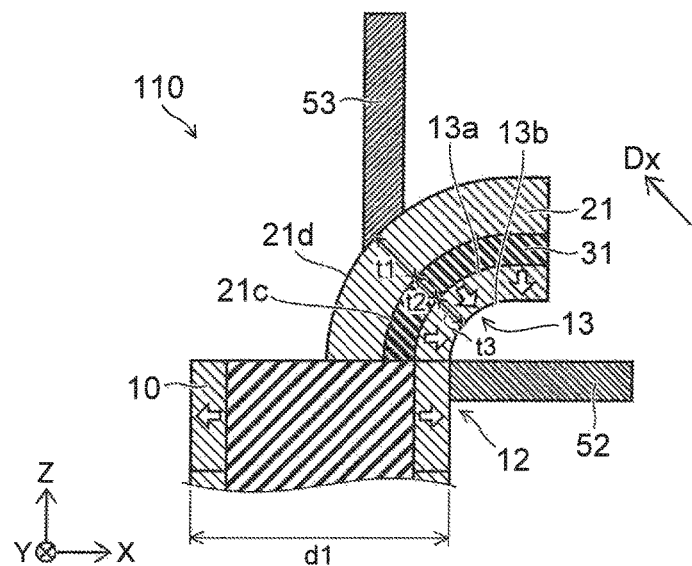
FIG. 2

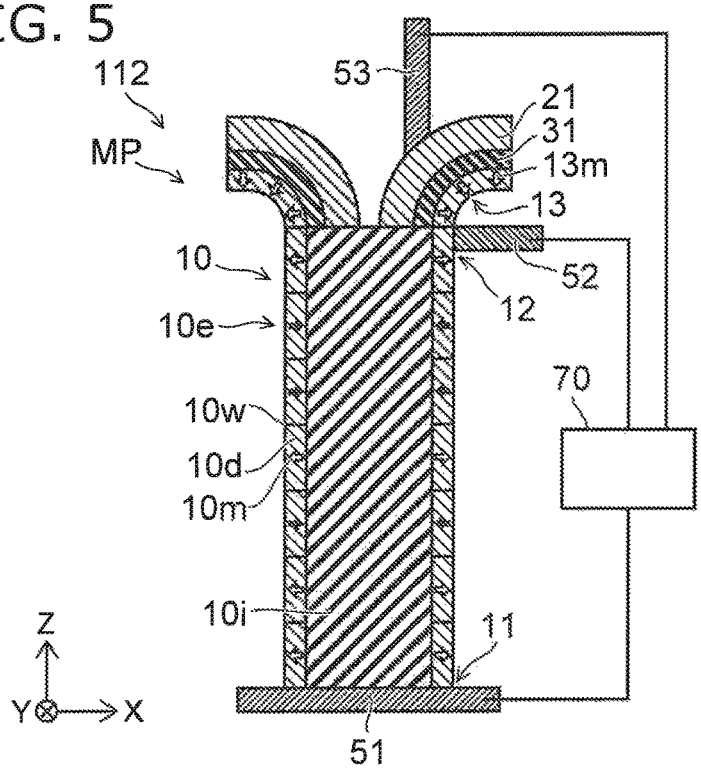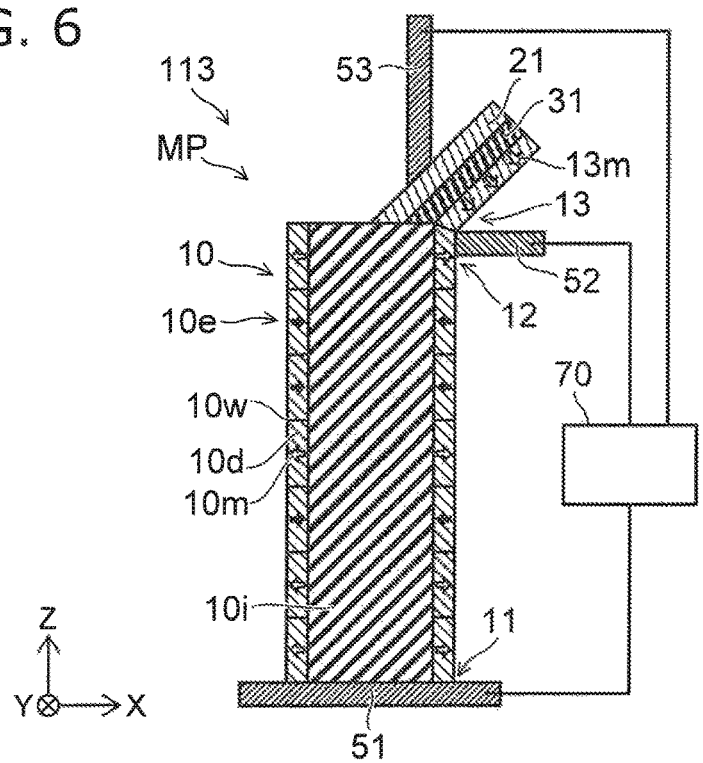

MAGNETIC MEMORY DEVICE

CROSS-REFERENCE TO RELATED APPLICATIONS

This application is based upon and claims the benefit of priority from Japanese Patent Application No. 2017-178745, filed on Sep. 19, 2017; the entire contents of which are incorporated herein by reference.

FIELD

Embodiments described herein relate generally to a magnetic memory device.

BACKGROUND

There is a magnetic memory device including a magnetic shift register using a magnetic body. It is desirable to increase the storage density of the magnetic memory device.

BRIEF DESCRIPTION OF THE DRAWINGS

FIG. 1A and FIG. 1B are schematic views illustrating a magnetic memory device according to a first embodiment;

FIG. 2 is a schematic view illustrating the magnetic memory device according to the first embodiment;

FIG. 5 is a schematic plan view illustrating another magnetic memory device according to the first embodiment;

FIG. 6 is a schematic plan view illustrating another magnetic memory device according to the first embodiment;

DETAILED DESCRIPTION

Figure 3A:
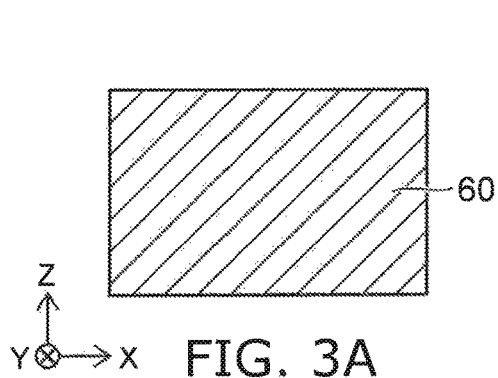
FIG. 3A to FIG. 3H are schematic views illustrating the method for manufacturing the magnetic memory device according to the first embodiment.

According to one embodiment, a magnetic memory device includes a first magnetic member, a first magnetic layer, and a first nonmagnetic layer. The first magnetic member includes a first extension portion and a third portion. The first extension portion extends along a first direction and includes a first portion and a second portion. The third portion is connected to the second portion. A direction from the first portion toward the second portion is aligned with the first direction. At least a portion of the third portion is tilted with respect to the first direction. The first nonmagnetic layer is provided between the first magnetic layer and the at least a portion of the third portion. The first nonmagnetic layer is provided along the at least a portion of the third portion and is tilted with respect to the first direction.

According to another embodiment, a magnetic memory device includes a first magnetic member, a first magnetic layer, and a first nonmagnetic layer. The first magnetic member includes a first extension portion and a third portion. The first extension portion extends along a first direction and includes a first portion and a second portion. The third portion is connected to the second portion. A direction from the first portion toward the second portion is aligned with the first direction. At least a portion of the third portion is aligned with the first direction. The first nonmagnetic layer is provided between the first magnetic layer and the at least a portion of the third portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A and FIG. 1B are schematic views illustrating a magnetic memory device according to a first embodiment.

FIG. 1A is a line A1-A2 cross-sectional view of FIG. 1B. FIG. 1B is a plan view as viewed along arrow AA of FIG. 1A.

As shown in FIG. 1A, the magnetic memory device 110 according to the first embodiment includes a first magnetic member 10, a first magnetic layer 21, and a first nonmagnetic layer 31.

The first magnetic member 10 includes a first extension portion 10e. The first extension portion 10e includes a first portion 11 and a second portion 12. The first extension portion 10e extends along a first direction. The direction from the first portion 11 toward the second portion 12 is aligned with the first direction (a Z-axis direction).

The first direction is taken as the Z-axis direction. One direction perpendicular to the Z-axis direction is taken as an X-axis direction. A direction perpendicular to the Z-axis direction and the X-axis direction is taken as a Y-axis direction.

In the example as shown in FIG. 1A and FIG. 1B, the first extension portion 10e has a tubular configuration extending along the first direction (the Z-axis direction). For example, the first extension portion 10e has a ring configuration when the first extension portion 10e is cut by the X-Y plane. The cross-sectional configuration of the first extension portion 10e is, for example, a circle (including a flattened circle), etc.

An insulating member 10i may be provided inside the first extension portion 10e.

The first magnetic member 10 further includes a third portion 13. The third portion 13 is connected to the second portion 12. In the embodiment, at least a portion of the third portion 13 is tilted with respect to the first direction (the Z-axis direction). For example, the direction from the at least a portion of the third portion 13 (e.g., the tilted portion)

toward the first magnetic layer 21 is tilted with respect to the first direction (the Z-axis direction).

The first nonmagnetic layer 31 is provided between the first magnetic layer 21 and the at least a portion of the third portion 13 recited above. For example, the first magnetic layer 21 does not directly contact the third portion 13. The first nonmagnetic layer 31 is provided along the at least a portion of the third portion and is tilted with respect to the first direction.

The first magnetic member 10 includes, for example, at least one selected from the group consisting of Fe, Co, and Ni. The first magnetic layer 21 includes, for example, at least one selected from the group consisting of Fe, Co, and Ni. The first nonmagnetic layer 31 includes, for example, MgO, etc. Other examples of these materials are described below.

The first magnetic member 10, the first magnetic layer 21, and the first nonmagnetic layer 31 are included in one memory portion MP. The first magnetic member 10 functions as, for example, an information storage portion of the memory portion MP.

For example, the first extension portion 10e is configured to retain multiple domain walls 10w. For example, the first extension portion 10e is configured to retain multiple magnetic domains 10d. Each of the multiple magnetic domains 10d has a magnetization 10m. For example, the orientation of the magnetization 10m is from the inner side toward the outer side of the tube. Or, the orientation of the magnetization 10m is, for example, from the outer side toward the inner side of the tube. The orientation of the magnetization 10m corresponds to the stored information. For example, the domain wall 10w corresponds to the boundary between regions (the magnetic domains 10d) having magnetizations 10m having different orientations.

The multiple domain walls 10w (or the multiple magnetic domains 10d) are movable along the first direction (the Z-axis direction) in the first extension portion 10e. The movement of the multiple domain walls 10w (or the multiple magnetic domains 10d) corresponds to a shift operation.

A first electrode 51, a second electrode 52, a third electrode 53, and a controller 70 are provided in the example. The first electrode 51 is electrically connected to the first portion 11. The second electrode 52 is electrically connected to the second portion 12. The third electrode 53 is electrically connected to the first magnetic layer 21. The controller 70 is electrically connected to the first electrode 51, the second electrode 52, and the third electrode 53.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor, a diode, or the like) is inserted between multiple conductive bodies, and a state is formable in which a current flows between the multiple conductive bodies.

The controller 70 is configured to perform a first operation, a second operation, and a third operation. In the first operation, information is written to the third portion 13. The information that is written to the third portion 13 is movable in the first extension portion 10e via the second portion 12. In the second operation, the written information is shifted inside the third portion 13 and the first extension portion 10e. In the third operation, the information of the third portion 13 is read.

For example, in the first operation (e.g., the write operation), the controller 70 applies a voltage between the second electrode 52 and the third electrode 53. For example, the orientation of the magnetization of the third portion 13 is controlled by the current flowing between the first magnetic layer 21 and the third portion 13.

In the second operation (e.g., the shift operation), the controller 70 causes a first current to flow between the first electrode 51 and the third electrode 53. Thereby, the multiple domain walls 10w (or the multiple magnetic domains 10d) of the first extension portion 10e and the third portion 13 are moved (shifted). For example, the direction of the shift corresponds to the orientation of the first current.

In the third operation (e.g., the read operation), the controller 70 senses a value (e.g., at least one of a resistance value, a voltage value, or a current value) corresponding to the electrical resistance between the first magnetic layer 21 and the third portion 13.

Thus, in the magnetic memory device 110, the write operation, the shift operation, and the read operation are performed.

The portion that includes the first magnetic layer 21, the first nonmagnetic layer 31, and the third portion 13 functions as, for example, a write/read portion.

In the embodiment as described above, at least a portion of the third portion 13 is tilted with respect to the first direction (the Z-axis direction). On the other hand, there is a first reference example in which the third portion 13 extends along the X-Y plane from the second portion 12. In the embodiment, because at least a portion of the third portion 13 is tilted with respect to the Z-axis direction, the length in the X-Y plane of the third portion 13 can be short compared to the first reference example. Thereby, for example, the occupied surface area of one memory portion MP can be small compared to the first reference example.

On the other hand, there is a second reference example in which the third portion 13 extends to be tilted in a ring configuration. In the embodiment, although there is movement in the Z-axis direction, the length of the third portion 13 in the Y-axis direction in the X-Y plane is not increased; thereby, the current of the shift operation for the read operation can be small compared to that of the second reference example. In the embodiment, the operating current can be reduced with high storage density.

According to the embodiment, a magnetic memory device can be provided in which the storage density can be increased. In the magnetic memory device 110, it is favorable for the length (the length when projected onto the X-Y plane) along the circumferential direction of the third portion 13 to be shorter than the length along the circumferential direction of the extension portion 10e. For example, the current of the shift operation for the read operation can be small.

FIG. 2 is a schematic view illustrating the magnetic memory device according to the first embodiment.

FIG. 2 shows an enlarged portion of FIG. 1A.

In the example of the magnetic memory device 110, the third portion 13 is curved. In the embodiment, at least a portion of the third portion 13 may be curved. Even in such a case, the storage density can be increased.

The third portion 13 has a first surface 13a and a second surface 13b. The first surface 13a opposes the first nonmagnetic layer 31. The second surface 13b is a surface opposite the first surface 13a. The first surface 13a is convex. The second surface 13b is concave.

The first magnetic layer 21 has a third surface 21c and a fourth surface 21d. The third surface 21c opposes the first nonmagnetic layer 31. The fourth surface 21d is a surface opposite the third surface 21c. The third surface 21c is concave. The fourth surface 21d is convex.

Due to such a curve, a difference occurs between the surface areas of the third surface 21c (the inner surface) and the fourth surface 21d (the outer surface) of the first magnetic layer 21. For example, the surface area of the fourth surface 21d is greater than the surface area of the third surface 21c. Thereby, the current density at the third surface 21c can be increased.

For example, a state can be obtained in which the first magnetic member 10 is cut by the X-Z plane. For example, the direction from the at least a portion of the third portion 13 recited above (the tilted portion) toward the first magnetic layer 21 is taken as a tilt direction Dx (a tilt direction). A state can be obtained in which the first magnetic layer 21 is cut by a plane (the X-Z plane) including the tilt direction Dx and the first direction (the Z-axis direction). In the cross section, the length of the fourth surface 21d is longer than the length of the third surface 21c. Thereby, the current density at the third surface 21c can be increased.

For example, in the write operation, the orientation of the magnetization of the third portion 13 can be reversed by a current density that is higher than the magnetization reversal current density. In the embodiment, the current density is increased by the third portion 13 being curved. Thereby, the current that is necessary for the reversal of the orientation of the magnetization can be small compared to that of the case where the third portion 13 is not curved. For example, the operating current of the write operation can be reduced.

A thickness t1 of the first magnetic layer 21 is, for example, not less than 5 nm and not more than 20 nm. The thickness t1 is the thickness of the first magnetic layer 21 along the direction (the tilt direction Dx) from the first magnetic layer 21 toward the at least a portion of the third portion 13 recited above (the tilted portion).

A thickness t2 of the at least a portion of the third portion 13 recited above (the tilted portion) is, for example, not less than 2 nm and not more than 10 nm. The thickness t2 is the thickness of the at least a portion of the third portion 13 recited above along the direction (the tilt direction Dx) from the first magnetic layer 21 toward the at least a portion of the third portion 13 recited above (the tilted portion).

A thickness t3 of the first nonmagnetic layer 31 is, for example, not less than 0.5 nm and not more than 2 nm. The thickness t3 is the thickness of the first nonmagnetic layer 31 along the direction (the tilt direction Dx) from the first magnetic layer 21 toward the at least a portion of the third portion 13 recited above (the tilted portion).

A width d1 of the first extension portion 10e is, for example, not less than 10 nm and not more than 100 nm. The width d1 is the length of the first extension portion 10e along a direction perpendicular to the first direction (the Z-axis direction).

In one example, the width d1 is 50 nm; the curvature radius of the third portion 13 is 10 nm; and the thickness t2 is 4 nm. The thickness t1 is, for example, 15 nm. In such a case, the surface area of the fourth surface 21d is about 1.1 times the surface area of the third surface 21c. For example, the write current density at the third surface 21c can be increased. For example, the error rate can be reduced for the same write current. For example, a low error rate is obtained even in the case where the storage density is increased.

An example of a method for manufacturing the magnetic memory device 110 according to the embodiment will now be described.

FIG. 3A to FIG. 3H are schematic views illustrating the method for manufacturing the magnetic memory device according to the first embodiment.

An insulating portion 60 is provided as shown in FIG. 3A. For example, the insulating portion 60 is provided on a not-illustrated substrate, etc.

Figure 3E:
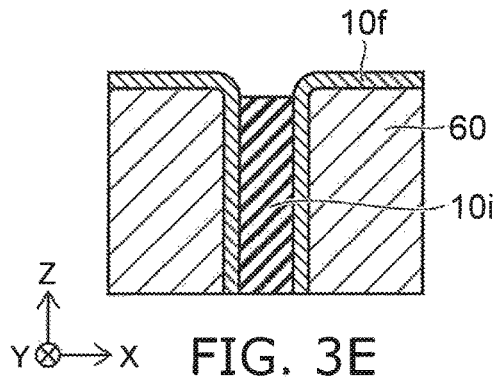
Figure 3B:
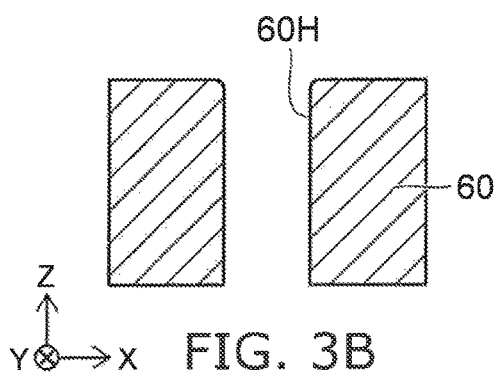

As shown in FIG. 3B, a hole 60H is formed in the insulating portion 60. The hole 60H extends in the Z-axis direction.

Figure 3F:
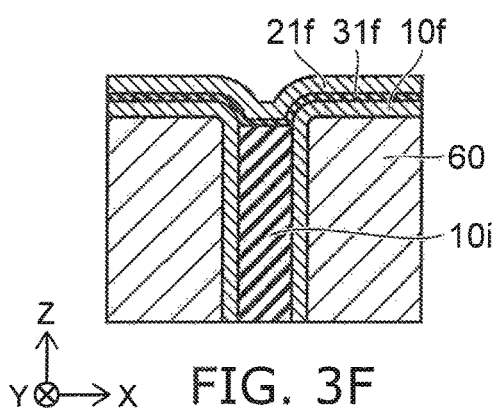
Figure 3C:
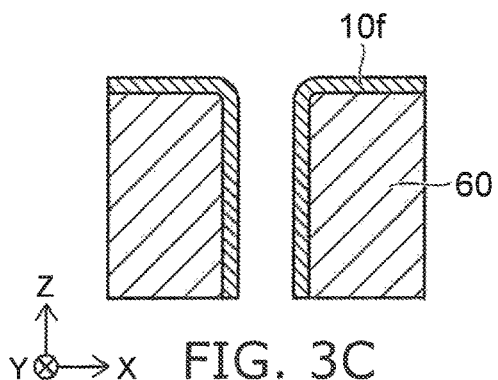

As shown in FIG. 3C, a first magnetic film 10f is formed on the front surface of the insulating portion 60 and the side surface of the hole 60H. The first magnetic film 10f is used to form at least a portion of the first magnetic member 10.

Figure 3G:
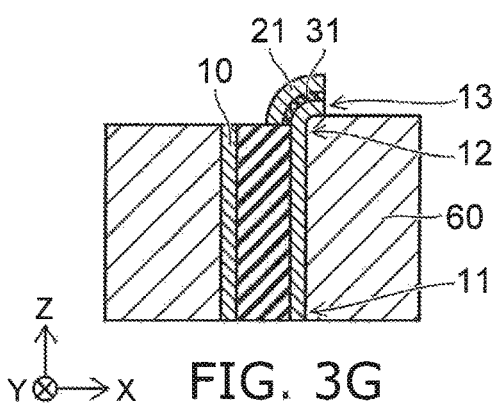
Figure 3D:
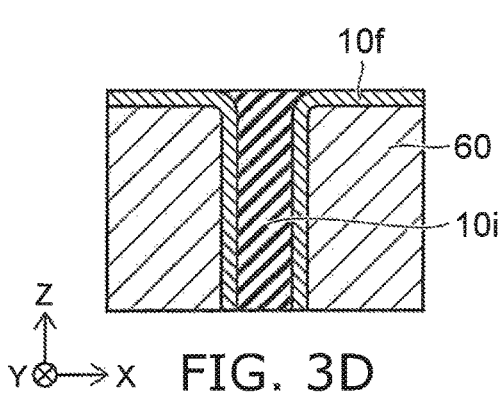

As shown in FIG. 3D, an insulating film that is used to form the insulating member 10i is formed in the remaining space of the hole 60H. Planarization is performed as necessary.

As shown in FIG. 3E, the insulating film that is used to form the insulating member 10i is recessed. For example, etching such as RIE or the like is performed. Thereby, the insulating member 10i is obtained.

As shown in FIG. 3F, a first nonmagnetic film 31f is formed; and a second magnetic film 21f is formed on the first nonmagnetic film 31f. The first nonmagnetic film 31f is used to form the first nonmagnetic layer 31. The second magnetic film 21f is used to form the first magnetic layer 21.

As shown in FIG. 3G, a portion of the stacked film of the first magnetic film 10f, the first nonmagnetic film 31f, and the second magnetic film 21f on a portion of the upper surface of the insulating portion 60 is removed. Thereby, the third portion 13, the first nonmagnetic layer 31, and the first magnetic layer 21 are obtained.

Figure 3H:
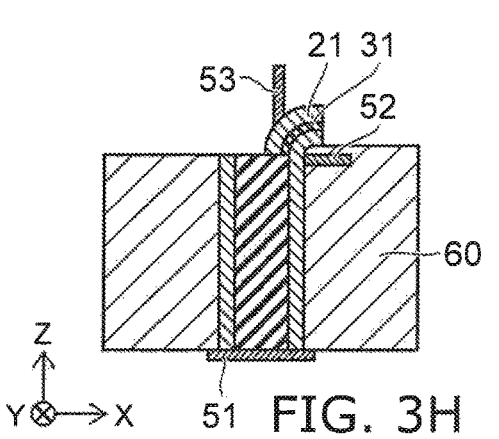

The first electrode 51, the second electrode 52, and the third electrode 53 are formed as shown in FIG. 3H. Thereby, the magnetic memory device 110 is obtained. In the description recited above, the order of at least a portion of the multiple processes may be interchanged within the extent of technical feasibility.

Figure 4:
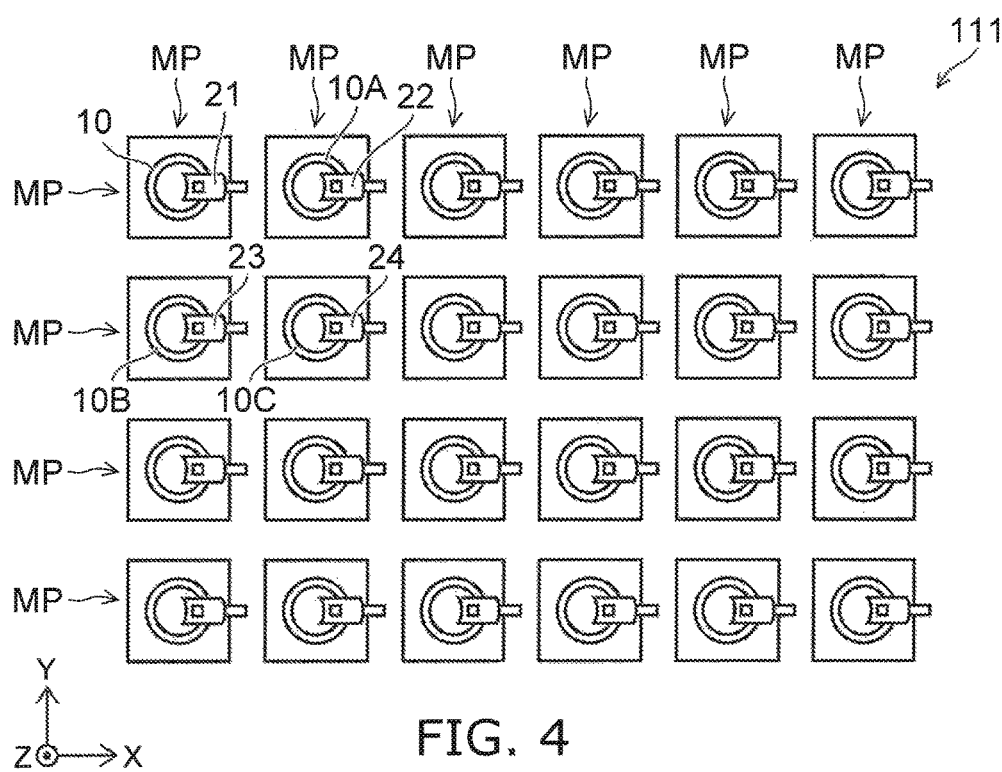
FIG. 4 is a schematic plan view illustrating another magnetic memory device according to the first embodiment.

FIG. 4 is a schematic plan view illustrating another magnetic memory device according to the first embodiment.

As shown in FIG. 4, the magnetic memory device 111 according to the embodiment includes multiple memory portions MP. As described above, one of the multiple memory portions MP includes the first magnetic member 10, the first magnetic layer 21, and the first nonmagnetic layer 31. The first nonmagnetic layer 31 is not illustrated in FIG. 4.

The multiple memory portions MP are arranged in two directions (e.g., the X-axis direction and the Y-axis direction) crossing the first direction (the Z-axis direction). For example, the multiple memory portions MP are arranged in a matrix configuration.

For example, a second magnetic member 10A, a third magnetic member 10B, a fourth magnetic member 10C, etc., are provided in addition to the first magnetic member 10. For example, the direction from the first magnetic member 10 toward the second magnetic member 10A is aligned with the X-axis direction. For example, the direction from the first magnetic member 10 toward the third magnetic member 10B is aligned with the Y-axis direction. For example, the direction from the third magnetic member 10B toward the fourth magnetic member 10C is aligned with the X-axis direction. For example, the direction from the second magnetic member 10A toward the third magnetic member 10B is aligned with the Y-axis direction. A second magnetic layer 22 is provided to correspond to the second magnetic member 10A. A third magnetic layer 23 is provided to correspond to the third magnetic member 10B. A fourth magnetic layer 24 is provided to correspond to the fourth magnetic member 10C. The configurations of the second magnetic member 10A, the third magnetic member 10B, and the fourth magnetic member 10C each are similar to the configuration of the first magnetic member 10.

In the embodiment as described above, the size of one memory portion MP can be small because the third portion 13 is tilted. The storage density can be increased.

FIG. 5 is a schematic plan view illustrating another magnetic memory device according to the first embodiment.

In the magnetic memory device 112 according to the embodiment as shown in FIG. 5, the third portion 13 has a ring configuration. Otherwise, the configuration of the magnetic memory device 112 is similar to that of the magnetic memory device 110. In the magnetic memory device 112 as well, the storage density can be increased.

FIG. 6 is a schematic plan view illustrating another magnetic memory device according to the first embodiment.

In the magnetic memory device 113 according to the embodiment as shown in FIG. 6, the third portion 13 is not curved. The third portion 13 has, for example, a planar configuration. Otherwise, the configuration of the magnetic memory device 113 is similar to that of the magnetic memory device 110. In the magnetic memory device 113 as well, the storage density can be increased.

Figure 7:
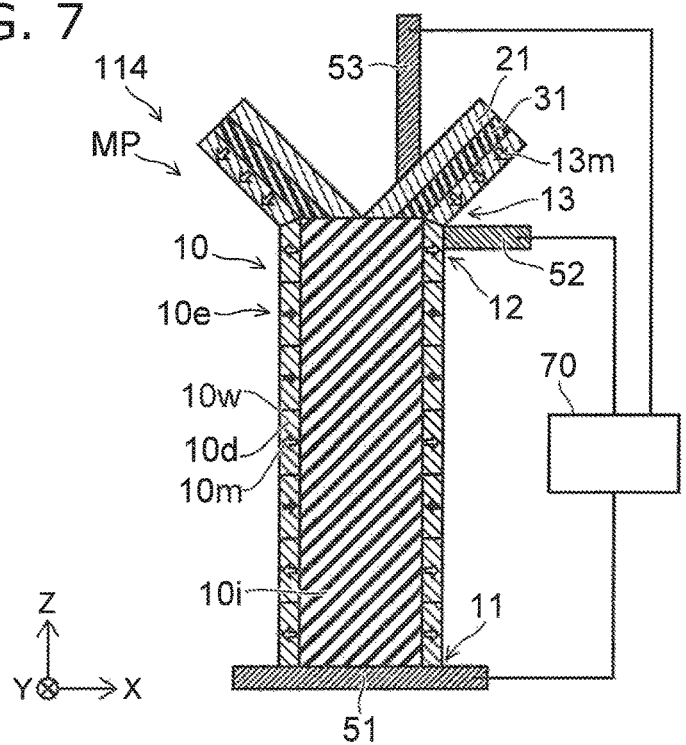
FIG. 7 is a schematic plan view illustrating another magnetic memory device according to the first embodiment.

FIG. 7 is a schematic plan view illustrating another magnetic memory device according to the first embodiment.

In the magnetic memory device 114 according to the embodiment as shown in FIG. 7, the third portion 13 has a ring configuration. Otherwise, the configuration of the magnetic memory device 114 is similar to that of the magnetic memory device 113. In the magnetic memory device 114 as well, the storage density can be increased.

Second Embodiment

Figures 8A, 8B:
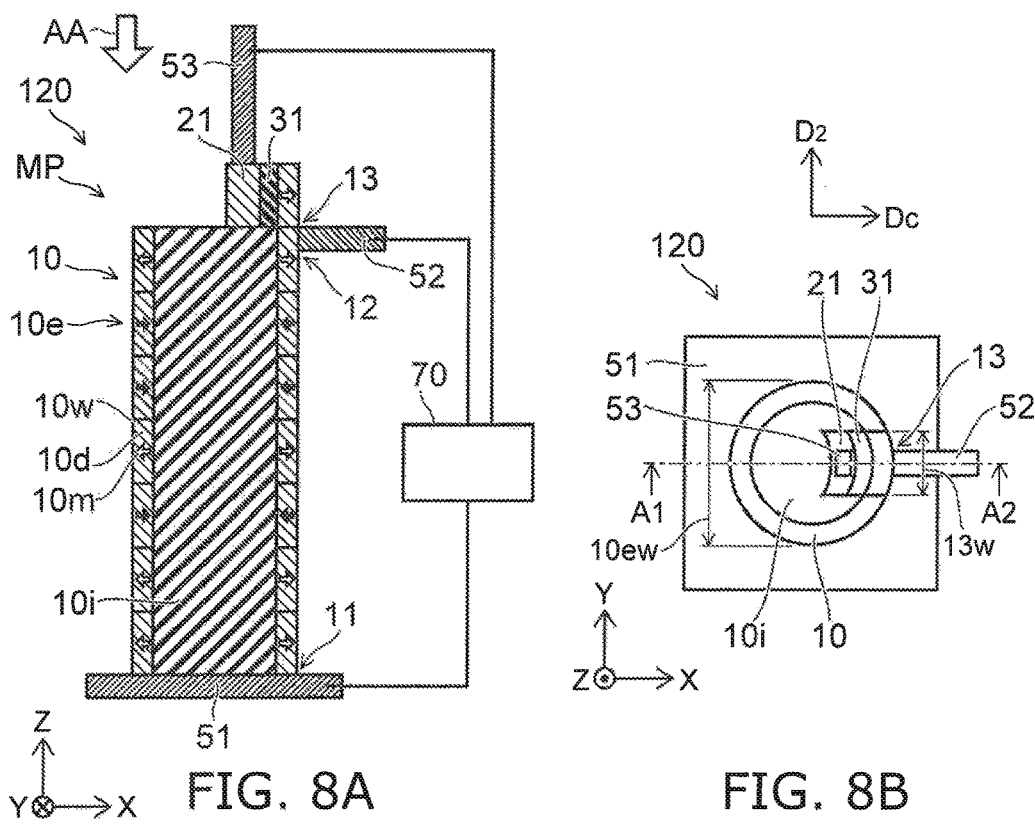
FIG. 8A and FIG. 8B are schematic views illustrating a magnetic memory device according to a second embodiment.

FIG. 8A and FIG. 8B are schematic views illustrating a magnetic memory device according to a second embodiment.

FIG. 8A is a line A1-A2 cross-sectional view of FIG. 8B. FIG. 8B is a plan view as viewed along arrow AA of FIG. 8A.

As shown in FIG. 8A and FIG. 8B, the magnetic memory device 120 according to the second embodiment also includes the first magnetic member 10, the first magnetic layer 21, and the first nonmagnetic layer 31.

In the magnetic memory device 120 as well, the first magnetic member 10 includes the first extension portion 10e and the third portion 13. The first extension portion 10e includes the first portion 11 and the second portion 12 and extends along the first direction (the Z-axis direction). The third portion 13 is connected to the second portion 12. Even in such a case, the direction from the first portion 11 toward the second portion 12 is aligned with the first direction (e.g., the Z-axis direction). At least a portion of the third portion 13 is aligned with the first direction (the Z-axis direction). Even in such a case, the first nonmagnetic layer 31 is provided between the first magnetic layer 21 and the at least a portion of the third portion 13 recited above. For example, the first magnetic layer 21 does not directly contact the third portion 13.

For example, the direction from the at least a portion of the third portion 13 recited above toward the first magnetic layer 21 crosses the first direction (the Z-axis direction). For example, the direction from the at least a portion of the third portion 13 recited above toward the first magnetic layer 21 is perpendicular to the first direction (the Z-axis direction).

In the magnetic memory device 120 as well, for example, the occupied surface area of one memory portion MP can be small. For example, the current of the shift operation for the read operation can be small.

As shown in FIG. 8B, the direction from the first magnetic layer 21 toward the at least a portion of the third portion 13 recited above is taken as a cross direction Dc. A direction that crosses a plane (e.g., the Z-X plane) including the cross direction Dc and the first direction (the Z-axis direction) is taken as a second direction D2. The second direction D2 is, for example, the Y-axis direction. In the magnetic memory device 120, a length 13w of the third portion 13 along the second direction D2 is narrower than a width 10ew of the first extension portion 10e along the second direction D2.

An example of a method for manufacturing the magnetic memory device 120 according to the embodiment will now be described.

FIG. 9A to FIG. 9H are schematic views illustrating the method for manufacturing the magnetic memory device according to the second embodiment.

Figure 9A:
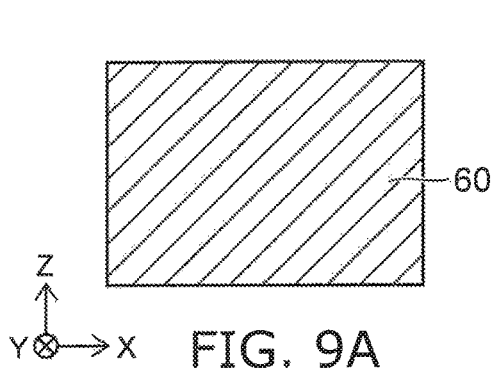
FIG. 9A to FIG. 9H are schematic views illustrating the method for manufacturing the magnetic memory device according to the second embodiment.

The insulating portion 60 is provided as shown in FIG. 9A. As shown in FIG. 9B, the hole 60H is formed in the insulating portion 60. The hole 60H extends in the Z-axis direction. As shown in FIG. 9C, the first magnetic film 10f is formed on the front surface of the insulating portion 60 and the side surface of the hole 60H. As shown in FIG. 9D, an insulating film that is used to form the insulating member 10i is formed in the remaining space of the hole 60H. Planarization is performed as necessary.

Figure 9E:
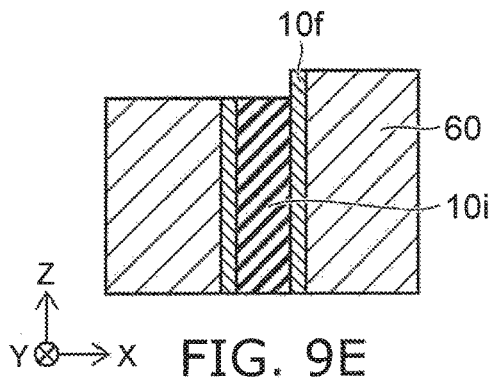
Figure 9B:
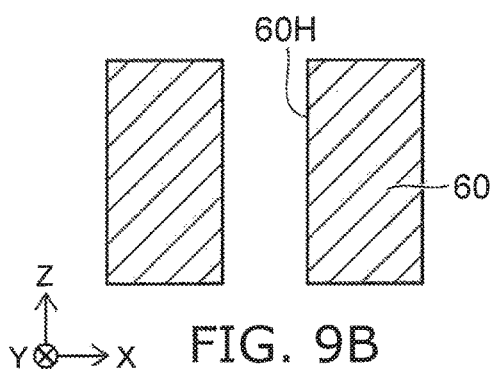
Figure 9F:
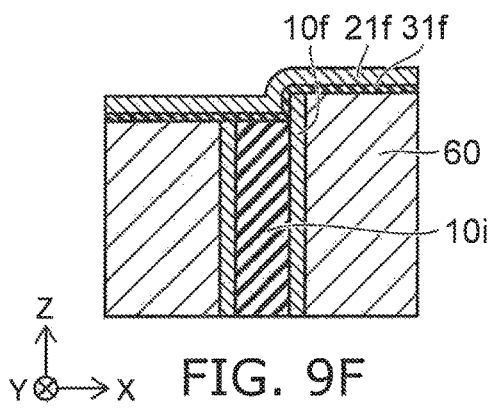
Figure 9C:
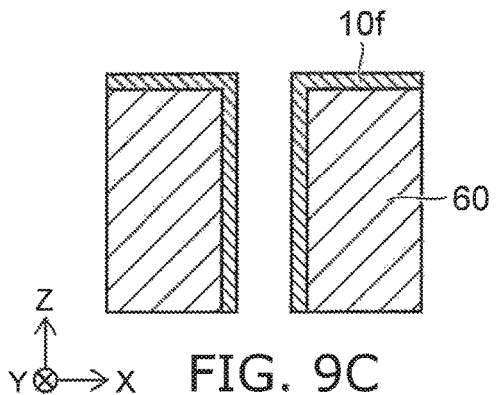
Figure 9G:
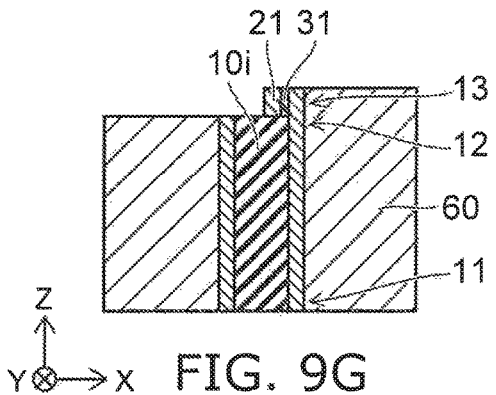
Figure 9D:
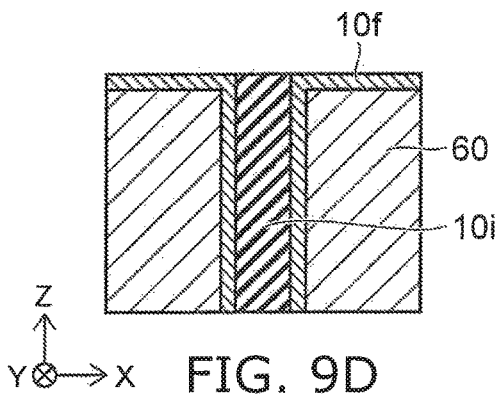
Figure 9H:
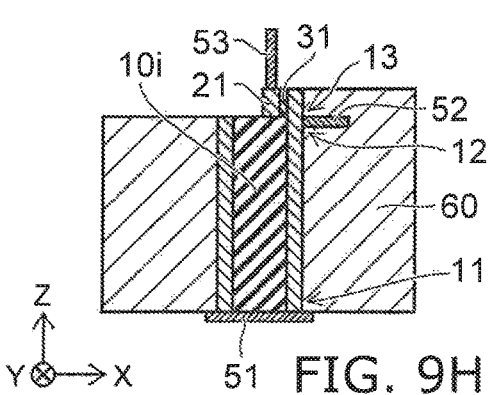

As shown in FIG. 9E, a portion of the insulating portion 60 and the insulating film that is used to form the insulating member 10i are recessed. A level difference is formed. As shown in FIG. 9F, the first nonmagnetic film 31f is formed; and the second magnetic film 21f is formed on the first nonmagnetic film 31f. As shown in FIG. 9G, a portion of the stacked film of the first magnetic film 10f, the first nonmagnetic film 31f, and the second magnetic film 21f is removed. Thereby, the third portion 13, the first nonmagnetic layer 31, and the first magnetic layer 21 are obtained at the level difference portion. For example, the third portion 13, the first nonmagnetic layer 31, and the first magnetic layer 21 are stacked along the X-axis direction. The first electrode 51, the second electrode 52, and the third electrode 53 are formed as shown in FIG. 9H. Thereby, the magnetic memory device 120 is obtained. In the description recited above, the order of at least a portion of the multiple processes may be interchanged within the extent of technical feasibility.

In the second embodiment as well, the multiple memory portions MP may be provided similarly to the magnetic memory device 111 described above (referring to FIG. 4). The multiple memory portions MP are arranged in two directions (e.g., the X-axis direction and the Y-axis direction) crossing the first direction (the Z-axis direction).

Figure 10:
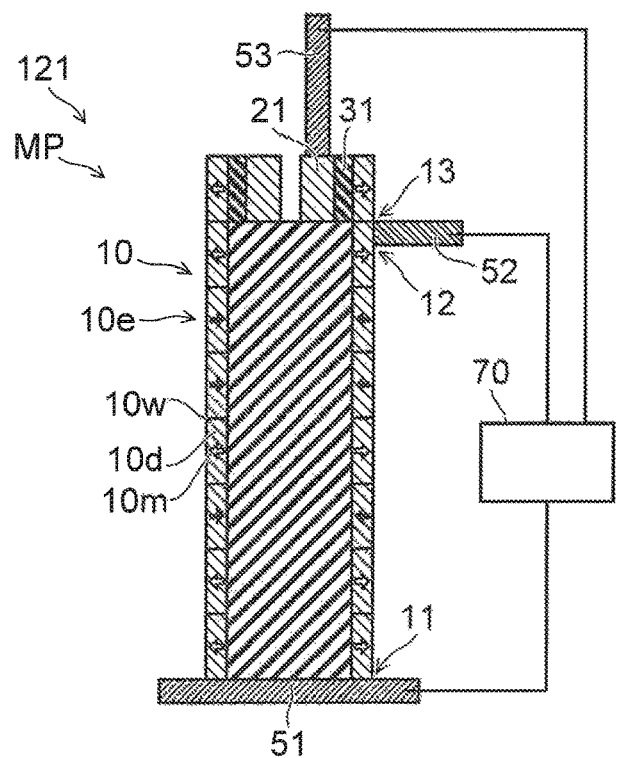
FIG. 10 is a schematic cross-sectional view illustrating another magnetic memory device according to the second embodiment.

FIG. 10 is a schematic cross-sectional view illustrating another magnetic memory device according to the second embodiment.

FIG. 10 is a cross-sectional view corresponding to a line A1-A2 cross-sectional view of FIG. 8B.

As shown in FIG. 10, the magnetic memory device 121 according to the second embodiment also includes the first magnetic member 10, the first magnetic layer 21, and the first nonmagnetic layer 31. In the magnetic memory device 121, the third portion 13 has a ring configuration. The first magnetic layer 21 and the first nonmagnetic layer 31 also have ring configurations. In the magnetic memory device 121 as well, the storage density can be increased.

Figure 11:
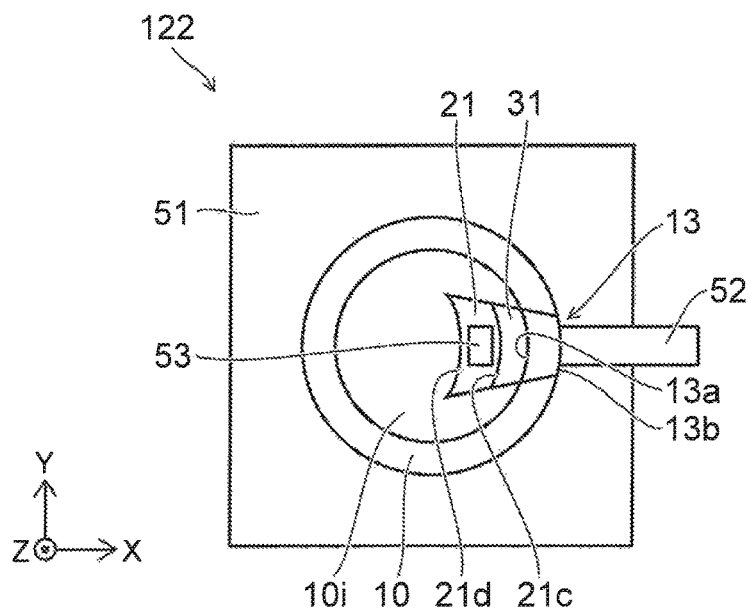
FIG. 11 is a schematic plan view illustrating another magnetic memory device according to the second embodiment.

FIG. 11 is a schematic plan view illustrating another magnetic memory device according to the second embodiment.

FIG. 11 is a plan view corresponding to a plan view as viewed along arrow AA of FIG. 8A.

As shown in FIG. 11, the magnetic memory device 122 according to the second embodiment also includes the first magnetic member 10, the first magnetic layer 21, and the first nonmagnetic layer 31. In the magnetic memory device 122, the size of the first magnetic layer 21 is different from the size of the third portion 13.

The first magnetic layer 21 has the third surface 21c opposing the first nonmagnetic layer 31, and the fourth surface 21d opposite the third surface 21c. The length of the fourth surface 21d is longer than the length of the third surface 21c when the first magnetic layer 21 is cut by a plane (the X-Y plane) perpendicular to the first direction (the Z-axis direction). For example, the surface area of the fourth surface 21d is greater than the surface area of the third surface 21c.

For example, the current density that flows through the third surface 21c is increased. The current that is necessary for changing the orientation of the magnetization can be small. For example, the operating current of the write operation can be reduced.

In the magnetic memory device 122, for example, the third portion 13 has the first surface 13a opposing the first nonmagnetic layer 31, and the second surface 13b opposite the first surface 13a. In the example, the first surface 13a is concave; and the second surface 13b is convex.

Examples of the materials of the embodiments will now be described.

The first magnetic member 10 includes, for example, a perpendicular magnetization film.

The first magnetic member 10 may include, for example, a rare earth-transition metal amorphous alloy. The rare earth-transition metal amorphous alloy includes, for example, an alloy including a rare earth-transition metal and a 3d transition metal. The rare earth-transition metal amorphous alloy is, for example, a ferrimagnet. The rare earth-transition metal amorphous alloy includes, for example, at least one transition metal and at least one selected from the group consisting of Tb (terbium), Dy (dysprosium), and Gd (gadolinium). The rare earth-transition metal amorphous alloy includes, for example, at least one selected from the group consisting of TbFe, TbCo, TbFeCo, DyTbFeCo, GdTbCo, and GdFeCo.

The first magnetic member 10 may include, for example, a multilayer film. The first magnetic member 10 includes, for example, at least one selected from the group consisting of a multilayer film including a Co film and a Ni film, a multilayer film including a Co film and a Pd film, and a multilayer film including a Co film and a Pt film.

The first magnetic member 10 may include, for example, an ordered alloy. The ordered alloy includes, for example, at least one selected from the group consisting of Fe, Co, and Ni, and at least one selected from the group consisting of Pt and Pd. The crystal structure of the ordered alloy is, for example, the $L_{10}$-type. The ordered alloy may include, for example, at least one selected from the group consisting of $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$. The composition ratio of the ordered alloy is not limited to that recited above.

The first magnetic member 10 may include an ordered alloy and another element. The other element includes, for example, at least one selected from the group consisting of V, Mn, Cu, Cr, and Ag. By adding these elements, for example, the magnetic anisotropy energy or the saturation magnetization may be adjusted. For example, a large magnetic anisotropy energy is obtained.

The first magnetic layer 21 includes, for example, at least one selected from the group consisting of Fe, Co, and Ni. The first magnetic layer 21 may include, for example, an alloy including at least one selected from the group consisting of Fe, Co, and Ni. The first magnetic layer 21 may further include, for example, another element (e.g., a semimetal). The other element includes, for example, at least one selected from the group consisting of boron and silicon. The first magnetic layer 21 may include, for example, a multilayer film. The multilayer film includes a first film and a second film. The first film includes, for example, at least one selected from the group consisting of Fe, Co, and Ni. The second film includes a platinum group metal (e.g., Pt, Pd, etc.). The first magnetic layer 21 includes, for example, a multilayer film including a Ni film and a film of a Co—Fe alloy.

At least one of the first electrode 51, the second electrode 52, or the third electrode 53 includes, for example, at least one selected from the group consisting of Cu, Ag, Au, and Al. At least one of these electrodes may include an alloy including at least one of these elements.

The first nonmagnetic layer 31 includes, for example, at least one selected from the group consisting of aluminum oxide ($AlO_x$), aluminum nitride (AlN), magnesium oxide (MgO), magnesium nitride ($Mg_3N_2$), silicon oxide ($SiO_2$), silicon nitride (Si—N), silicon oxynitride (Si—O—N), $TiO_2$, and $Cr_2O_3$. These materials function as, for example, a nonmagnetic tunneling barrier. The first nonmagnetic layer 31 may include, for example, a nonmagnetic metal. For example, the spin torque is transferred effectively by the appropriate material (and thickness) of the first nonmagnetic layer 31.

Third Embodiment

Figure 12:
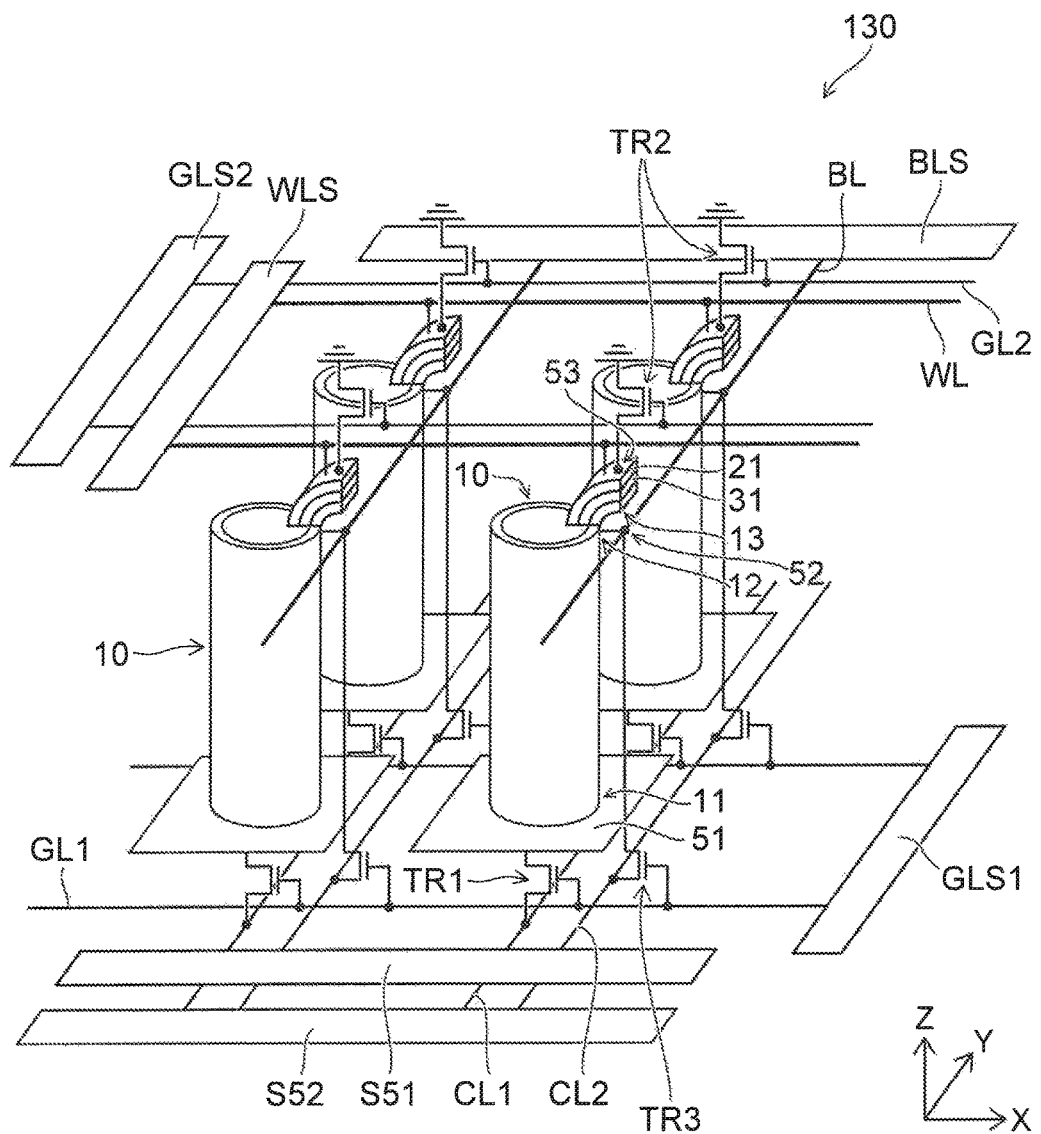
FIG. 12 is a schematic perspective view illustrating another magnetic memory device according to a third embodiment.

FIG. 12 is a schematic perspective view illustrating another magnetic memory device according to a third embodiment.

As shown in FIG. 12, the magnetic memory device 130 according to the third embodiment includes multiple memory portions MP. For example, the memory portion MP has the configuration described in the first and second embodiments. In the magnetic memory device 130, for example, the multiple memory portions MP are arranged in an array configuration along the X-axis direction and the Y-axis direction.

A first common gate line selector GLS1, a second electrode selector S52, a first electrode selector S51, a bit line selector BLS, a word line selector WLS, and a second common gate line selector GLS2 are provided in the magnetic memory device 130.

The first common gate line selector GLS1 is connected to multiple first common gate lines GL1. For example, the first common gate lines GL1 extend in the X-axis direction.

The second electrode selector S52 is connected to multiple first common interconnects CL1. For example, the first common interconnects CL1 extend in the Y-axis direction.

The first electrode selector S51 is connected to multiple second common interconnects CL2. For example, the second common interconnects CL2 extend in the Y-axis direction.

The bit line selector BLS is connected to multiple bit lines BL. For example, the bit lines BL extend in the Y-axis direction. For example, the bit line BL is electrically connected to the second electrode 52.

The word line selector WLS is connected to multiple word lines WL. For example, the word lines WL extend in the X-axis direction.

The second common gate line selector GLS2 is connected to multiple second common gate lines GL2. For example, the second common gate lines GL2 extend in the X-axis direction.

Multiple first transistors TR1, multiple second transistors TR2, and multiple third transistors TR3 are provided in the magnetic memory device 130.

For example, the first transistors TR1 and the third transistors TR3 are provided under the multiple memory portions MP. The second transistors TR2 are provided on the multiple memory portions MP.

The gate of the first transistor TR1 is connected to the first common gate line GL1. One of the terminals of the first transistor TR1 other than the gate is connected to the first common interconnect CL1. Another of the terminals of the first transistor TR1 other than the gate is connected to the second electrode 52 of one memory portion MP.

The gate of the second transistor TR2 is connected to the second common gate line GL2. One of the terminals of the second transistor TR2 other than the gate is connected to the magnetic layer (the first magnetic layer 21) of one memory portion MP. Another of the terminals of the second transistor TR2 other than the gate is connected to a fixed potential (e.g., the ground potential).

The gate of the third transistor TR3 is connected to the first common gate line GL1. One of the terminals of the third transistor TR3 other than the gate is connected to the second common interconnect CL2. Another of the terminals of the third transistor TR3 other than the gate is connected to the first electrode 51.

By the transistors and the selectors recited above, the recording and the reproducing of the information to any of the multiple memory portions MP is performed.

The embodiments may include the following configurations (e.g., technological proposals).

Configuration 1

A magnetic memory device, comprising:

a first magnetic member including a first extension portion and a third portion, the first extension portion extending along a first direction and including a first portion and a second portion, the third portion being connected to the second portion, a direction from the first portion toward the second portion being aligned with the first direction, at least a portion of the third portion being tilted with respect to the first direction;

a first magnetic layer; and a first nonmagnetic layer provided between the first magnetic layer and the at least a portion of the third portion, the first nonmagnetic layer being provided along the at least a portion of the third portion and being tilted with respect to the first direction.

Configuration 2

The magnetic memory device according to Configuration 1, wherein at least a portion of the third portion is curved.

Configuration 3

The magnetic memory device according to Configuration 2, wherein the first nonmagnetic layer is curved along the at least a portion of the third portion.

Configuration 4

The magnetic memory device according to Configuration 2 or 3, wherein the first magnetic layer is curved along the at least a portion of the third portion.

Configuration 5

The magnetic memory device according to any one of Configurations 1 to 4, wherein the third portion has a first surface and a second surface, the first surface opposing the first nonmagnetic layer, the second surface being opposite the first surface, the first surface is convex, and the second surface is concave.

Configuration 6

The magnetic memory device according to any one of Configurations 1 to 5, wherein the first magnetic layer has a third surface and a fourth surface, the third surface opposing the first nonmagnetic layer, the fourth surface being opposite the third surface, and a length of the fourth surface is longer than a length of the third surface when the first magnetic layer is cut by a plane, the plane including the first direction and a direction from the at least a portion of the third portion toward the first magnetic layer.

Configuration 7

The magnetic memory device according to any one of Configurations 1 to 6, wherein the first magnetic layer has a third surface and a fourth surface, the third surface opposing the first nonmagnetic layer, the fourth surface being opposite the third surface, and a surface area of the fourth surface is greater than a surface area of the third surface.

Configuration 8

A magnetic memory device, comprising:

a first magnetic member including a first extension portion and a third portion, the first extension portion extending along a first direction and including a first portion and a second portion, the third portion being connected to the second portion, a direction from the first portion toward the second portion being aligned with the first direction, at least a portion of the third portion being aligned with the first direction;

a first magnetic layer; and a first nonmagnetic layer provided between the first magnetic layer and the at least a portion of the third portion.

Configuration 9

The magnetic memory device according to Configuration 8, wherein a direction from the at least a portion of the third portion toward the first magnetic layer crosses the first direction.

Configuration 10

The magnetic memory device according to any one of Configurations 1 to 9, wherein the first extension portion has a tubular configuration extending along the first direction.

Configuration 11

The magnetic memory device according to Configuration 10, wherein a length of the third portion along a second direction is narrower than a width of the first extension portion along the second direction, the second direction crossing a plane including the first direction and a direction from the first magnetic layer toward the at least a portion of the third portion.

Configuration 12

The magnetic memory device according to Configuration 8 or 9, wherein the first magnetic layer has a third surface and a fourth surface, the third surface opposing the first nonmagnetic layer, the fourth surface being opposite the third surface, and a length of the fourth surface is longer than a length of the third surface when the first magnetic layer is cut by a plane perpendicular to the first direction.

Configuration 13

The magnetic memory device according to Configuration 1 or 8, wherein a thickness of the at least a portion of the third portion along a direction is not less than 2 nm and not more than 10 nm, the direction being from the first magnetic layer toward the at least a portion of the third portion.

Configuration 14

The magnetic memory device according to Configuration 13, wherein a thickness of the first magnetic layer along the direction is not less than 5 nm and not more than 20 nm, the direction being from the first magnetic layer toward the at least a portion of the third portion.

Configuration 15

The magnetic memory device according to Configuration 13 or 14, wherein a thickness of the first nonmagnetic layer along the direction is not less than 0.5 nm and not more than 2 nm, the direction being from the first magnetic layer toward the at least a portion of the third portion.

Configuration 16

The magnetic memory device according to any one of Configurations 13 to 15, wherein a width of the first extension portion along a direction perpendicular to the first direction is not less than 10 nm and not more than 100 nm.

Configuration 17

The magnetic memory device according to any one of Configurations 1 to 16, wherein the first extension portion is configured to retain multiple magnetic domains.

Configuration 18

The magnetic memory device according to any one of Configurations 1 to 17, wherein the first magnetic member, the first magnetic layer, and the first nonmagnetic layer are included in one memory portion, the memory portion is multiply provided, and the multiple memory portions are arranged in two directions crossing the first direction.

Configuration 19

The magnetic memory device according to any one of Configurations 1 to 18, further comprising:

a first electrode electrically connected to the first portion;

a second electrode electrically connected to the second portion;

a third electrode electrically connected to the first magnetic layer; and a controller electrically connected to the first electrode, the second electrode, and the third electrode, the controller applying a voltage between the second electrode and the third electrode in a first operation of writing information to the third portion, the controller causing a first current to flow between the first electrode and the third electrode in a second operation of shifting information written to the first extension portion.

Configuration 20

The magnetic memory device according to Configuration 19, wherein the controller senses, in a third operation of reading information of the third portion, a value corresponding to an electrical resistance between the first magnetic layer and the third portion.

According to the embodiments, a magnetic memory device can be provided in which the storage density can be increased.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor or the like) is inserted between multiple conductive bodies, and a state is formable in which a current flows between the multiple conductive bodies.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic memory device such as the magnetic member, the magnetic layer, the nonmagnetic layer, the electrode, the controller, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All magnetic memory devices practicable by an appropriate design modification by one skilled in the art based on the magnetic memory devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first magnetic member including a first extension portion and a third portion, the first extension portion extending along a first direction and including a first portion and a second portion, the third portion being connected to the second portion, a direction from the first portion toward the second portion being aligned with the first direction, at least a portion of the third portion being tilted with respect to the first direction;
a first magnetic layer; and
a first nonmagnetic layer provided between the first magnetic layer and the at least a portion of the third portion, the first nonmagnetic layer being provided along the at least a portion of the third portion and being tilted with respect to the first direction, wherein
the first magnetic layer has a third surface and a fourth surface, the third surface opposing the first nonmagnetic layer, the fourth surface being opposite the third surface, and
a length of the fourth surface is longer than a length of the third surface when the first magnetic layer is cut by a plane, the plane including the first direction and a direction from the at least a portion of the third portion toward the first magnetic layer.

2. The device according to claim 1, wherein at least a portion of the third portion is curved.

3. The device according to claim 2, wherein the first nonmagnetic layer is curved along the at least a portion of the third portion.

4. The device according to claim 2, wherein the first magnetic layer is curved along the at least a portion of the third portion.

5. The device according to claim 1, wherein
the third portion has a first surface and a second surface, the first surface opposing the first nonmagnetic layer, the second surface being opposite the first surface,
the first surface is convex, and
the second surface is concave.

6. The device according to claim 1, wherein
the first magnetic layer has a third surface and a fourth surface, the third surface opposing the first nonmagnetic layer, the fourth surface being opposite the third surface, and
a surface area of the fourth surface is greater than a surface area of the third surface.

7. The device according to claim 1, wherein the first extension portion has a tubular configuration extending along the first direction.

8. The device according to claim 1, wherein the first extension portion is configured to retain a plurality of magnetic domains.

9. The device according to claim 1, further comprising:
a first electrode electrically connected to the first portion;
a second electrode electrically connected to the second portion;
a third electrode electrically connected to the first magnetic layer; and
a controller electrically connected to the first electrode, the second electrode, and the third electrode,
the controller applying a voltage between the second electrode and the third electrode in a first operation of writing information to the third portion,
the controller causing a first current to flow between the first electrode and the third electrode in a second operation of shifting information written to the first extension portion.

10. The device according to claim 9, wherein the controller senses, in a third operation of reading information of the third portion, a value corresponding to an electrical resistance between the first magnetic layer and the third portion.

11. A magnetic memory device, comprising:
a first magnetic member including a first extension portion and a third portion, the first extension portion extending along a first direction and including a first portion and a second portion, the third portion being connected to the second portion, a direction from the first portion toward the second portion being aligned with the first direction, at least a portion of the third portion being aligned with the first direction;
a first magnetic layer; and
a first nonmagnetic layer provided between the first magnetic layer and the at least a portion of the third portion,
wherein
the first magnetic layer has a third surface and a fourth surface, the third surface opposing the first nonmagnetic layer, the fourth surface being opposite the third surface, and
a length of the fourth surface is longer than a length of the third surface when the first magnetic layer is cut by a plane perpendicular to the first direction.

12. The device according to claim 11, wherein a direction from the at least a portion of the third portion toward the first magnetic layer crosses the first direction.

13. A magnetic memory device, comprising:
a first magnetic member including a first extension portion and a third portion, the first extension portion extending along a first direction and including a first portion and a second portion, the third portion being connected to the second portion, a direction from the first portion toward the second portion being aligned with the first direction, at least a portion of the third portion being tilted with respect to the first direction;
a first magnetic layer; and
a first nonmagnetic layer provided between the first magnetic layer and the at least a portion of the third portion, the first nonmagnetic layer being provided along the at least a portion of the third portion and being tilted with respect to the first direction,
wherein the first extension portion has a tubular configuration extending along the first direction, and
a length of the third portion along a second direction is narrower than a width of the first extension portion along the second direction, the second direction crossing a plane including the first direction and a direction from the first magnetic layer toward the at least a portion of the third portion.

14. A magnetic memory device, comprising:
a first magnetic member including a first extension portion and a third portion, the first extension portion extending along a first direction and including a first portion and a second portion, the third portion being connected to the second portion, a direction from the first portion toward the second portion being aligned with the first direction, at least a portion of the third portion being tilted with respect to the first direction;
a first magnetic layer; and
a first nonmagnetic layer provided between the first magnetic layer and the at least a portion of the third portion, the first nonmagnetic layer being provided along the at least a portion of the third portion and being tilted with respect to the first direction,
wherein a thickness of the at least a portion of the third portion along a direction is not less than 2 nm and not more than 10 nm, the direction being from the first magnetic layer toward the at least a portion of the third portion, and
a width of the first extension portion along a direction perpendicular to the first direction is not less than 10 nm and not more than 100 nm.

15. The device according to claim 14, wherein a thickness of the first magnetic layer along the direction is not less than 5 nm and not more than 20 nm, the direction being from the first magnetic layer toward the at least a portion of the third portion.

16. The device according to claim 14, wherein a thickness of the first nonmagnetic layer along the direction is not less than 0.5 nm and not more than 2 nm, the direction being from the first magnetic layer toward the at least a portion of the third portion.

17. A magnetic memory device, comprising:
 a first magnetic member including a first extension portion and a third portion, the first extension portion extending along a first direction and including a first portion and a second portion, the third portion being connected to the second portion, a direction from the first portion toward the second portion being aligned with the first direction, at least a portion of the third portion being tilted with respect to the first direction;
 a first magnetic layer; and
 a first nonmagnetic layer provided between the first magnetic layer and the at least a portion of the third portion, the first nonmagnetic layer being provided along the at least a portion of the third portion and being tilted with respect to the first direction,
 wherein
 the first magnetic member, the first magnetic layer, and the first nonmagnetic layer are included in one memory portion,
 a plurality of the memory portions is provided, and
 the plurality of memory portions is arranged in two directions crossing the first direction.

* * * * *